(12) United States Patent  
Opie

(10) Patent No.: US 6,501,270 B1  
(45) Date of Patent: Dec. 31, 2002

(54) HALL EFFECT SENSOR ASSEMBLY WITH CAVITIES FOR INTEGRATED CAPACITORS

(75) Inventor: John Opie, Stony Creek, CT (US)

(73) Assignee: Siemens VDO Automotive Corporation, Auburn Hills, MI (US)

( * ) Notice: Subject to any disclaimer, the term of this patent is extended or adjusted under 35 U.S.C. 154(b) by 0 days.

(21) Appl. No.: 09/570,717

(22) Filed: May 15, 2000

(51) Int. Cl.[7] ............................................... G01R 33/07
(52) U.S. Cl. ..................................... 324/251; 324/207.2
(58) Field of Search ................................. 324/251, 252, 324/207.2; 174/52.2; 327/510, 511; 338/32 H

(56) References Cited

U.S. PATENT DOCUMENTS

| | | | | |
|---|---|---|---|---|
| 4,270,087 A | * | 5/1981 | Littwin | .................... 324/205 |
| 5,059,746 A | * | 10/1991 | Hayes et al. | ................ 174/52.1 |
| 5,414,355 A | * | 5/1995 | Davidson et al. | ........ 324/207.2 |
| 5,451,868 A | * | 9/1995 | Lock | .......................... 324/173 |
| 5,822,849 A | * | 10/1998 | Casali et al. | .................. 29/827 |

* cited by examiner

Primary Examiner—Edward Lefkowitz  
Assistant Examiner—Reena Aurora

(57) ABSTRACT

A Hall effect sensor and capacitor assembly includes leadless chip type capacitors employed as EMI shielding/ESD protection and bypass capacitors. In a first embodiment, a molded carrier structure provides a housing for mounting a Hall cell element as well as one or more EMI shielding or bypass capacitors. The carrier housing facilitates interconnection of the Hall cell and the chip capacitor. Additionally, this structure simplifies the manufacturing process for connection of the smaller leadless chip capacitor components. In an alternate embodiment, an insulated, molded encapsulation is applied and surrounds the chip capacitors and the connections to the Hall effect sensor leads.

18 Claims, 2 Drawing Sheets

HALL EFFECT SENSOR ASSEMBLY WITH CAVITIES FOR INTEGRATED CAPACITORS

BACKGROUND OF THE INVENTION

1. Field of the Invention

The present invention is directed generally to the field of electronic component subassemblies. More specifically, the present invention is directed to improved structures and methods for forming Hall effect sensor elements with integral EMI shielding capacitors.

2. Description of the Related Art

Electronic sensors are widely used in a variety of applications. The demand and use for these sensors is currently growing at a rapid rate. However, as with most electronic devices, there is an ever increasing demand for simplified manufacturing processes as well as decreasing the physical size of the device packages. Currently, typical Hall effect sensor elements overcome problems associated with electromagnetic interference (EMI) and electro static discharge (ESD) through the use of bypass capacitors appropriately connected to the Hall effect sensor elements. In these known designs, capacitors are connected by some method of soldering, welding, etc. to form an operational electronic subassembly to be used in the manufacture of automotive or other sensors.

During these known manufacturing processes, it is necessary that a device or person accurately grasps and positions each of the components during the connection process. Typically, epoxy clad radial lead capacitors are chosen for their desired packaging. However, the relatively large size of these components and their often irregular body shape make them less than optimal for achieving the goals of improving the manufacturing process and minimizing the overall size of the sensor package. Furthermore, in terms of performance, EMI suppression and ESD protection are enhanced by locating the capacitors physically closer to the Hall element than is typically possible with this type of capacitor package.

Due to the limitations imposed by the large capacitor bodies, the ability to achieve the desired results is limited in these prior systems. Although much smaller capacitor packages are currently available, their size is disproportionate to the equipment in the sensor assembly process and the fragile structure requires protection from damage by subsequent processing of the overall package. Thus, existing packaging solutions have limitation in their current requirement to use their relatively sized epoxy clad radial lead capacitors.

Accordingly, there remains a need in the art to improve manufacturing processes of Hall effect sensor assemblies through decreasing the physical size of the overall assembly. Additionally, there remains a need in the art to improve the manufacturing process associated with Hall effect assemblies. Other objects and advantages of the present invention will be apparent from the following summary and detailed description of the preferred embodiments.

SUMMARY OF THE INVENTION

In accordance with the present invention, in order to decrease the overall package size of the Hall effect sensor element and improve the manufacturing process, leadless chip type capacitors are employed as EMI shielding/ESD protection and bypass capacitors. The problems identified above that were associated with the use of these smaller components are overcome by the use of a carrier package in one embodiment of the present invention. In an alternate embodiment, an insulated, molded encapsulation is applied and surrounds the chip capacitors and the connections to the Hall effect sensor.

In a first exemplary embodiment of the present invention, a molded carrier structure provides a housing for mounting a Hall cell element as well as one or more EMI shielding/ESD protection or bypass capacitors. The carrier housing facilitates interconnection of the Hall cell and the chip capacitor. Additionally, this structure simplifies the manufacturing process for connection of the smaller leadless chip capacitor components.

In one exemplary embodiment, the Hall cell is cradled in extended arms of the carrier housing. Leads from the Hall cell are received within cavities of the carrier and one or more chip capacitors are received in a further cavity formed within the carrier housing. The carrier housing is comprised of a molded insulative body, preferably formed from heat resistant plastic. Although it is not necessary, it is preferred that a plurality of individual cavities be formed in order to facilitate the easy placement of each of the individual chip capacitor components as well as protection for the overall assembly. The Hall cell and leads and one or more leadless chip capacitors are placed in their appropriate cavities of the carrier housing during the manufacturing process. Subsequently, the necessary solder connections are formed to provide electrical contact between the Hall cell and EMI shielding/ESD protection bypass capacitors.

In one alternate embodiment of the invention, the chip carrier housing includes a spring pressure element which applies pressure between the leads of the Hall cell and the leadless chip carrier elements. This ensures better electrical contact between the respective elements. After the leadless chip capacitors have been soldered to the appropriate leads of the Hall cell, epoxy or other insulative material is applied to fill in the remaining spaces of the cavities thereby providing a more durable physical package.

In an alternate embodiment, the Hall cell has leads which protrude from its body on which one or more EMI shielding/ESD protection bypass capacitors are mounted. These bypass capacitors are desirably leadless chip type capacitors. Once the leadless chip type capacitors have been soldered to their respective leads from the Hall cell, an epoxy or other insulative encapsulation is applied, preferably within a mold to surround the chip capacitors and leads. The use of chip capacitors in either embodiment provides an overall smaller package for the Hall effect sensor.

DETAILED DESCRIPTION OF THE PREFERRED EMBODIMENT

Figure 1:
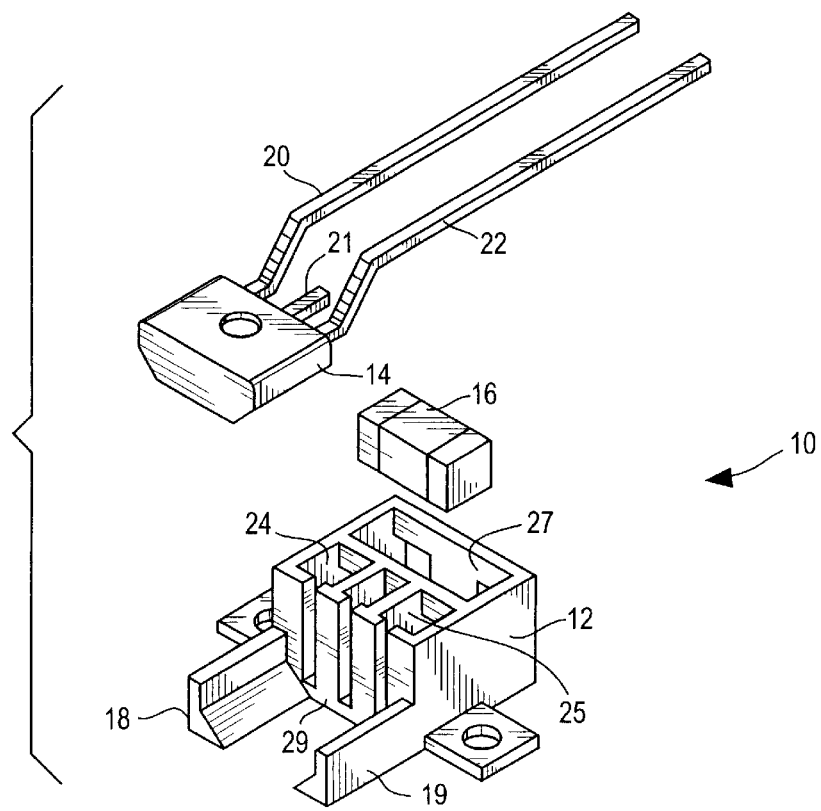
FIG. 1 illustrates a first exemplary embodiment of the invention which employs a housing for mounting the Hall sensor and shielding capacitors.

FIG. 1 illustrates an exemplary embodiment of the present invention, wherein leadless chip type capacitors are employed as EMI shielding/ESD protection and bypass capacitors for a Hall effect sensor assembly which is shown generally at 10. The problems associated with the use of the smaller chip capacitor components are overcome by the use of a carrier package 12 as shown in this embodiment of the present invention.

In this first exemplary embodiment of the present invention, the molded carrier structure 12 provides a housing for mounting a Hall cell element 14 as well as one or more EMI shielding/ESD protection or bypass capacitors 16, only one of which is illustrated for the sake of convenience. The carrier housing 12 facilitates interconnection of the Hall cell 14 and the chip capacitor 16. Additionally, this structure 12 simplifies the manufacturing process for connection of the smaller leadless chip capacitor components 16.

In this exemplary embodiment, the Hall cell 14 is cradled in extended arms 18, 19 of the carrier housing 12. Leads 20, 21, 22 from the Hall cell 14 are received within cavities 24, 25 of the carrier 12 and one or more chip capacitors 16 are received in a further cavity 27 formed within the carrier housing 12. The carrier housing 12 is comprised of a molded insulative body 29, preferably formed from heat resistant plastic. Although it is not necessary, it is preferred that a plurality of individual cavities be formed in order to facilitate the easy placement of each of the individual chip capacitor components as well as protection for the overall assembly. The Hall cell and leads and one or more leadless chip capacitors are placed in their appropriate cavities of the carrier housing during the manufacturing process. Subsequently, the necessary solder connections are formed to provide electrical contact between the Hall cell leads and EMI shielding/ESD protection bypass capacitors 16.

Figure 2:
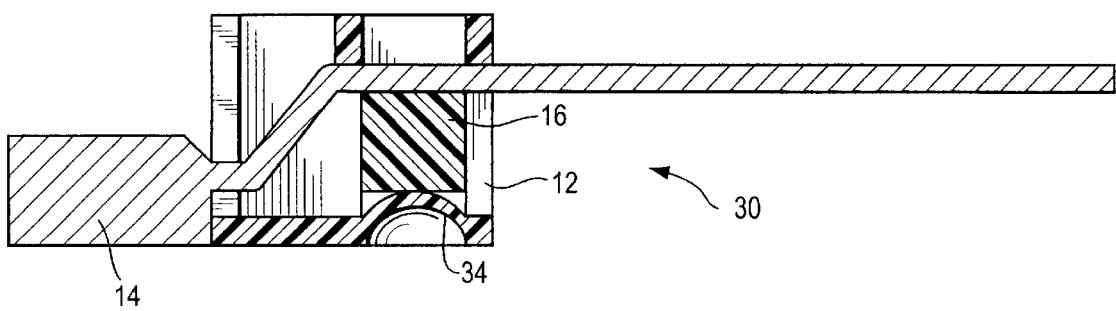
FIG. 2 is a side view illustration of the device shown in FIG. 1.

FIG. 2 illustrates an alternate embodiment of the invention shown in side view at 30 wherein the chip carrier housing 12 includes a spring pressure element 34 which applies pressure between the leads of the Hall cell and the leadless chip carrier elements. This ensures better electrical contact between the respective elements. After the leadless chip capacitors have been soldered to the appropriate leads of the Hall cell, epoxy or another insulative material is applied to fill in the remaining spaces of the cavities in the carrier housing 12 thereby providing a more durable physical package.

Figure 3:
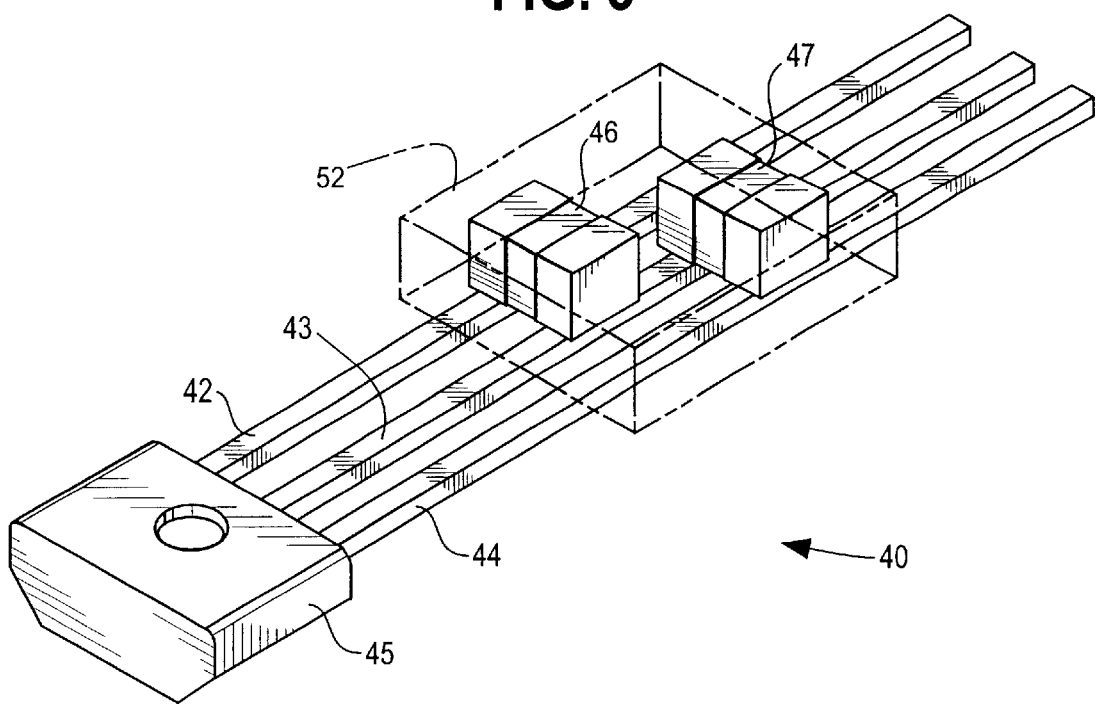
FIG. 3 is an illustration that shows an alternate embodiment of the invention wherein an insulative body surrounds the chip capacitors mounted to leads of a Hall sensor.

FIG. 3 shows yet another alternate embodiment which is shown generally at 40. In this alternate embodiment, the Hall sensor has leads 42, 43, 44 which protrude from its body 45. One or more EMI shielding/ESD protection bypass capacitors 46, 47 are mounted across the leads of the Hall sensor element 48. The bypass capacitors 46, 47 are desirably leadless chip type capacitors. Once the leadless chip type capacitors have been soldered to their respective leads for the Hall cell, an epoxy 52 or other insulative encapsulation is applied, preferably within a mold to surround the chip capacitors and leads.

The use of chip capacitors in either embodiment provides an overall smaller package for the Hall effect sensor. Additionally, the structures and methods described herein provide advantages over prior manufacturing processes while also providing a smaller more durable package for the overall assembly.

Figure 4:
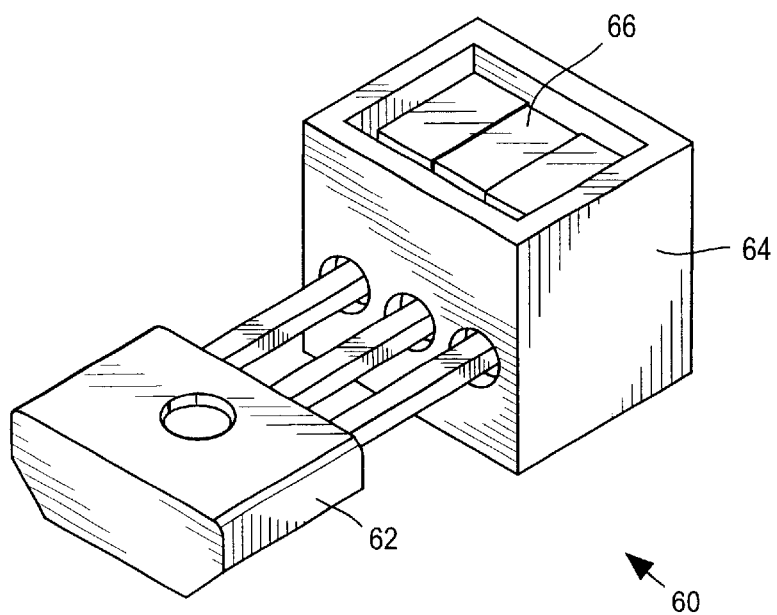
FIG. 4 illustrates an alternate embodiment of the present invention wherein a carrier housing surrounds only the leads of the Hall element.

It will be recognized by those skilled in the art that it is not necessary to form the carrier housing specifically as described herein. Although the carrier housing described above is the most desirable shape for the structure, it is contemplated that other molded carrier housings will be equally suitable. For example, any molded housing that provides a location for placement of the Hall cell element and one or more chip capacitors would be similarly suitable. It is desirable, however, that the carrier have a portion that is physically matched to receive the physical body of the Hall cell element as shown in FIG. 1. It is similarly desirable that the carrier housing have a portion that receives one or more chip capacitors. However, it will be recognized that neither of these desirable characteristics are required. For example, FIG. 4 illustrates a carrier housing shown generally at 60 wherein leads of a Hall element 62 are received within a carrier body 64 that has at least one cavity for receiving a chip capacitor 66. As with the prior embodiments described above, the cavity of this embodiment may be sealed in order to make a more durable package once the solder connections have been made.

What is claimed is:

1. A hall element and capacitor assembly for holding a hall element with a hall cell and electrical leads, comprising:
   a carrier housing mounting the hall cell and having at least one cavity separate from the hall cell and within which one or more leads of the Hall element are located; and
   a leadless chip capacitor having a defined height located within said cavity connected to one of said leads of the hall element; and wherein the cavity is defined by solid walls having a greater height then the capacitor.

2. The Hall element and capacitor assembly of claim 1, further comprising a second chip capacitor located within said cavity which is connected to another one of said leads.

3. The Hall element and capacitor assembly of claim 1, further comprising at least one Hall element support extending from said carrier housing adjacent to a body of the Hall element.

4. The Hall element and capacitor assembly of claim 1, further comprising an insulative material in said cavity adjacent to the chip capacitor.

5. The Hall element and capacitor assembly of claim 4, wherein the insulative material is epoxy.

6. The Hall element and capacitor assembly of claim 1, further comprising at least two Hall element supports extending from said carrier housing adjacent to a body of the Hall element.

7. A hall element and capacitor assembly comprising:
   a hall element having a plurality of leads extending from a body of the hall element;
   a leadless chip capacitor having a defined height electrically connected to at least one lead of the hall element; and
   a body of insulative material surrounding said leadless chip capacitor, having a greater height then the leadless chip capacitor and at least one lead of the hall element and separating the body of the hall element from said chip capacitor.

8. The Hall element and capacitor assembly of claim 7, wherein the insulative material is comprised of epoxy.

9. The Hall element and capacitor assembly of claim 7 comprising at least two chip capacitors connected between the leads of the Hall element.

10. A method of manufacturing a hall element and capacitor assembly comprising:
   providing a carrier housing having at least one cavity having a fixed height;
   installing a hall element having a hall cell and electrical leads, wherein the hall cell is separated from the at least one cavity;
   inserting one or more leads of the hall element into the cavity; and inserting a leadless chip capacitor having a shorter height than the cavity into said cavity and connecting the capacitor to one of said leads of the hall element.

11. The method of manufacturing a Hall element and capacitor assembly of claim 10, further comprising a step of inserting a second chip capacitor into said cavity and connecting said second chip capacitor to said leads.

12. The method of manufacturing a Hall element and capacitor assembly of claim 10, wherein said step of providing a carrier housing comprises a step of providing a carrier housing having at least one Hall element support extending from said carrier housing adjacent to a body of the Hall element.

13. The method of manufacturing a Hall element and capacitor assembly of claim 10, further comprising a step of inserting an insulative material in said cavity adjacent to the chip capacitor.

14. The method of manufacturing a Hall element and capacitor assembly of claim 13, wherein the insulative material is epoxy.

15. The method of manufacturing a Hall element and capacitor assembly of claim 10, wherein the carrier comprises at least two Hall element supports extending from said carrier housing adjacent to a body of the Hall element.

16. A method of manufacturing a Hall element and capacitor assembly comprising:

providing a Hall element having a plurality of leads extending from a body of the Hall element;

connecting a leadless chip capacitor having a defined height to at least of the hall element; and surrounding said leadless chip capacitor and at least one lead of the Hall element with a body of insulative material, the material having a height greater than the height of the capacitor and separating the body of the hall element by the body of the insulative material.

17. The method of manufacturing a Hall element and capacitor assembly of claim 16, wherein the insulative material is comprised of epoxy.

18. The method of manufacturing a Hall element and capacitor assembly of claim 16, comprising a step of connecting at least two chip capacitors between the leads of the Hall element.

* * * * *